(12) United States Patent
Cotte et al.

(10) Patent No.: US 7,056,837 B2
(45) Date of Patent: Jun. 6, 2006

(54) PROCESS OF INSULATING A SEMICONDUCTOR DEVICE USING A POLYMERIC MATERIAL

(75) Inventors: John M. Cotte, New Fairfield, CT (US); Kenneth John McCullough, Fishkill, NY (US); Wayne Martin Moreau, Wappinger, NY (US); Kevin Petrarca, Newburgh, NY (US); John P. Simons, Wappingers Falls, NY (US); Charles J. Taft, Wappingers Falls, NY (US); Richard Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 10/456,299

(22) Filed: Jun. 6, 2003

(65) Prior Publication Data

US 2003/0211312 A1 Nov. 13, 2003

Related U.S. Application Data

(62) Division of application No. 09/893,104, filed on Jun. 27, 2001, now abandoned.

(51) Int. Cl.
*H01L 21/31* (2006.01)
(52) U.S. Cl. ............................... 438/778; 427/337
(58) Field of Classification Search ............... None
See application file for complete search history.

(56) References Cited

U.S. PATENT DOCUMENTS

| | | | |
|---|---|---|---|
| 4,716,073 A | 12/1987 | Randa | 428/215 |
| 5,334,356 A * | 8/1994 | Baldwin et al. | 422/133 |
| 5,422,377 A * | 6/1995 | Aubert | 521/64 |
| 5,548,159 A | 8/1996 | Jeng | |
| 5,908,510 A | 6/1999 | McCullough et al. | |
| 5,965,679 A | 10/1999 | Godschalx et al. | |
| 5,965,934 A | 10/1999 | Cheung et al. | |
| 6,008,540 A | 12/1999 | Lu et al. | 257/758 |
| 6,077,792 A * | 6/2000 | Farrar | 438/780 |
| 6,083,565 A | 7/2000 | Carbonell et al. | 427/430.1 |
| 6,218,497 B1 | 4/2001 | Hacker et al. | |
| 6,284,810 B1 * | 9/2001 | Burnham et al. | 521/79 |
| 6,413,827 B1 * | 7/2002 | Farrar | 438/296 |
| 6,479,391 B1 | 11/2002 | Morrow et al. | 438/706 |
| 6,486,078 B1 * | 11/2002 | Rangarajan et al. | 438/778 |
| 6,612,317 B1 * | 9/2003 | Costantini et al. | 134/58 R |
| 6,764,873 B1 * | 7/2004 | Hichri et al. | 438/99 |
| 6,858,089 B1 * | 2/2005 | Castrucci | 134/2 |

* cited by examiner

*Primary Examiner*—David A. Zarneke
(74) *Attorney, Agent, or Firm*—Scully, Scott, Murphy & Presser, P.C.; Daniel P. Morris, Esq.

(57) ABSTRACT

A dielectric material formed by contacting a low dielectric constant polymer with liquid or supercritical carbon dioxide, under thermodynamic conditions which maintain the carbon dioxide in the liquid or supercritical state, wherein a porous product is formed. Thereupon, thermodynamic conditions are changed to ambient wherein carbon dioxide escapes from the pores and is replaced with air.

8 Claims, 1 Drawing Sheet

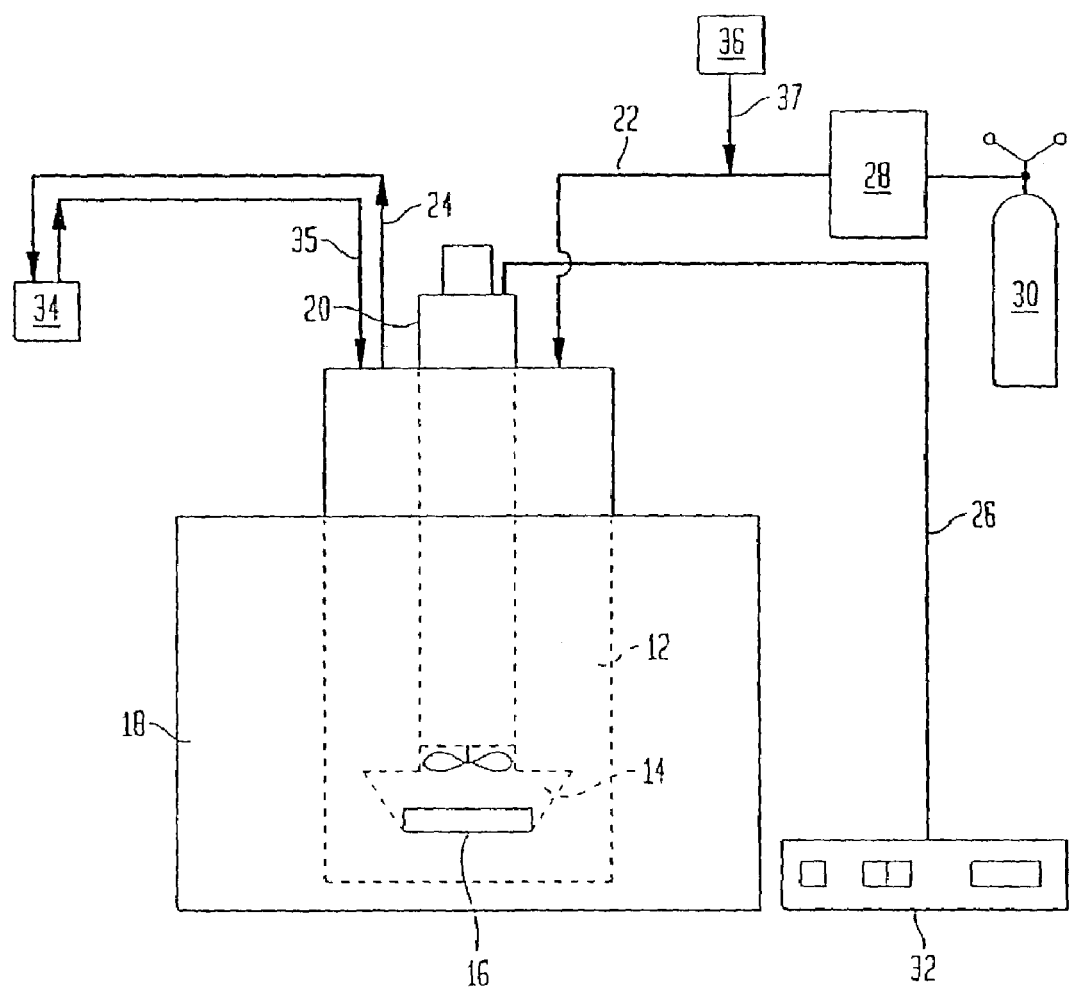

PROCESS OF INSULATING A SEMICONDUCTOR DEVICE USING A POLYMERIC MATERIAL

This application is a Divisional of application Ser. No. 09/893,104 filed on Jun. 27, 2001 and now abandoned.

BACKGROUND OF THE DISCLOSURE

1. Field of the Invention

The present invention is directed to a dielectric material and a process of insulating a semiconductor device using same. More specifically, the present invention is directed to a dielectric material prepared by introducing liquid or supercritical carbon dioxide into a polymeric dielectric film and employing the dielectric material to insulate semiconductor devices.

2. Background of the Prior Art

The explosive growth in complementary metal oxide semiconductors (CMOS) has corresponded with a continuing decrease in size of such devices. This decrease in CMOS size has been accompanied by thinner and thinner insulating film layers disposed between CMOSs in electrical assemblies. The requirement that insulating layers be provided as exceedingly thin films has occasioned increased numbers of electrical assembly failures due to electrical shorting. These failures, of course, are due to the inadequate insulating properties of such thin insulating materials.

This problem has not gone unnoticed in the art. Thus, many products and processes have been developed to provide more effective insulating materials having lower dielectric constants. Attention is directed to U.S. Pat. Nos. 5,548,159; 5,965,679; 5,965,934; and 6,218,497 which describe polymers having low dielectric constants designed for use in semiconductor applications. Among the polymers developed for use in this application are polyimides, fluorinated polyimides, polyorganohydridosilane, polysiloxanes, polyphenylenes, divinylsiloxane-bisbenzocyclobutene copolymers, polybenzil and polyarylethers.

The use of these polymeric materials has improved insulating characteristics and has reduced short failures of semiconductor-containing electrical assemblies. However, the employment of these newly developed polymers has not completely overcome the aforementioned "shorting" problem. That is, although the dielectric properties of these new polymers are lower than those used heretofore, the degree of electrical insulation provided by these newly developed polymers is oftentimes still inadequate to ensure against shorts between semiconductor devices separated by films of these polymers.

The aforementioned discussion, emphasizing the inability of polymeric films of dielectric materials to insulate between semiconductor devices, suggests that something more than the development of new polymers is required to provide adequate insulating capacity. Certainly, recent developments suggest a need in art for the development of polymeric materials having even lower dielectric constants than those developed to date to satisfy the stringent requirements imposed upon insulating materials used in semiconductor-containing electrical assemblies.

BRIEF SUMMARY OF THE INVENTION

A new class of polymeric materials having reduced dielectric constants, suitable for use in electrical assemblies employing recently developed smaller sized semiconductor devices, has now been developed.

In accordance with the present invention a new dielectric material is provided. The dielectric material is formed by disposing a polymeric material upon a substrate. The polymer, disposed upon said substrate, is thereupon contacted with liquid or supercritical carbon dioxide under thermodynamic conditions wherein the carbon dioxide is maintained in the liquid or supercritical state. The thermodyamic conditions are then altered to those of ambient temperature and pressure.

In further accordance with the present invention a process of insulating an electrical assembly which includes semiconductor devices is provided. In this process a polymeric material is disposed upon a surface of an electrical assembly. The electrical assembly is thereupon contacted with liquid or supercritical carbon dioxide under thermodyamic conditions consistent with the maintenance of carbon dioxide in the liquid or supercritical state. The thermodynamic conditions are thereupon adjusted to those of ambient temperature and pressure.

BRIEF DESCRIPTION OF THE DRAWING

The present invention will be better understood by reference to a FIGURE which is a schematic representation of an apparatus employed in a process of contacting a polymeric material with liquid or supercritical carbon dioxide.

DETAILED DESCRIPTION

Materials employed as electrical insulators are characterized by their low dielectric constants. Independent of whether the material is organic or inorganic, a material is deemed a candidate for use as an electrical insulator if it has a dielectric constant of no more than 5. Thus, such inorganic materials as silica, having a dielectric constant of 5, and organic polymers, such as a polyimide, which has a dielectric constant of about 4, are deemed excellent electrical insulators.

As those skilled in the art are aware, it is preferred that an organic polymeric material be utilized as an electrical insulator between semiconductor devices. This is so because it is far easier to cast a polymeric film upon an electrical assembly which includes semiconductor devices than to dispose an inorganic material thereupon. Among the preferred classes of polymers utilized as electrical insulators in electrical assemblies employing semiconductor devices are the aforementioned polyimides, as well as fluorinated polyimides, polyorganohydrosilane, polyphenylenes, polysiloxanes, copolymers of divinylsiloxane and bisbenzocyclobutene, polybenzil, polyarylethers and polytetraflurorethylene. Recently, polyphenylenes have become the preferred polymer in this application insofar as the dielectric constant of polyphenylene is lower than the previously most commonly used polymer, a polyimide.

A particularly preferred class of polyphenylene is the polymer referred to by its trademark name, SiLK®, a polymeric product made by Dow Chemical. Polymers marketed under the SiLK® trademark are described in U.S. Pat. No. 5,965,679, which is incorporated herein by reference. Polyphenylenes, such as SiLK®, have dielectric constants in the order of about 3.5.

A material having a dielectric constant as low as 3.5 provides excellent electrical insulating properties. The earlier discussion of requisite electrical insulating properties, however, establishes that even at these low dielectric constants requisite electrical insulation of very thin films is uncertain. Clearly, an insulating material having a dielectric constant below 3.5 is highly desired in the art.

An electrical insulator having a dielectric constant of less than 3.5 is provided in accordance with the process set forth below. Although the present invention is not limited by any theory explaining its operation, the insulator of the present invention is believed to represent a significant advance in the art because the introduction of air into the polymeric dielectric material reduces the dielectric constant to even below 3.5. This is so in that, as those skilled in the art are aware, the dielectric constant of air is 1. Thus, independent of the polymeric material employed, polymeric materials within the contemplation of the present invention have dielectric constants below those available in the prior art. The reduction in dielectric constant associated with the introduction of air may not be large in absolute terms but that reduction is associated with significant improvement in insulating capability.

The introduction of air into a polymeric insulating material is obtained in accordance with the process of the present invention. In this process a semiconductor device, such as a silicon wafer, is covered, on at least one of its surfaces, with an organic electrical insulator such as any of the aforementioned polymers mentioned above. Of these polymers, a polyphenylene is particularly preferred.

In a preferred embodiment of the present invention a porogen is provided. That is, prior to contact with liquid or supercritical carbon dioxide, the polymeric material is contacted with a porogen. The porogen of the present invention is preferably selected from the group consisting of water, acetone, toluene, methanol, ethanol, propanol and mixtures thereof. This list of preferred porogens should not be deemed exclusive. Other porogens may be substituted for those mentioned above.

Several methods of contact between the polymeric material and the porogen may be utilized. In a first method, the porogen is disposed on the surface of the polymer. This method is particularly preferred when a particularly preferred porogen, water, is employed.

A second method of introduction of the porogen is dissolving the porogen in the liquid or supercritical carbon dioxide prior to its contact with the polymeric material. In this process variation the polymer is contacted with a liquid or supercritical carbon dioxide composition wherein the second component, in addition to the carbon dioxide, is the porogen. In this embodiment the porogen is preferably selected from the group consisting of acetone, toluene, methanol ethanol and propanol. The porogen may be present in a concentration of up to 10% by weight, based on the total weight of the solution.

A third method of introduction of the porogen employs the expedient of providing a composition of the polymeric dielectric material wherein the porogen is dissolved therein. In this method the porogen is present in a concentration of up to about 1% by weight based on the weight of the polymer or the solubility of the porogen in the polymer which ever is less. For example, water is soluble in SiLK® polyphenylene only to the degree of 0.25% by weight and thus when a composition of water in the polymer SiLK® is employed, the maximum concentration of water is 0.25% by weight.

It is preferred that the porogen be present in a concentration of up to about 1% by weight, based on the weight of the polymer. More preferably, the concentration of the porogen is in the range of between about 0.01% and about 1% by weight, based on the total weight of the polymer.

In a particularly preferred embodiment the dielectric polymer is polyphenylene, i.e. SiLK®, and a porogen is employed. In that preferred embodiment it is preferred to dispose water on the surface of the polyphenylene film layer in a concentration of between about 0.01% to about 1% by weight, based on the weight of the SiLK® film.

Upon formation of pores, into which the carbon dioxide penetrates, the thermodynamic conditions extant in the processing unit are changed to ambient. At ambient temperature and pressure the carbon dioxide becomes a gas and escapes from the pores in the polymeric material. These pores are then filled with air, thus reducing the dielectric constant of the polymeric material.

Turning now to the FIGURE, an apparatus suitable for conducting the process of the present invention is provided. Therein, a semiconductor device, such as a silicon wafer or the like, upon whose surface a polymeric material having a low dielectric constant is disposed, is denoted by reference numeral 16. Although the polymer and, optionally, the porogen introducing steps may occur in the equipment illustrated in the FIGURE, it is preferred that these steps occur outside the apparatus. Independent of the site of these initial processing steps, the step of contacting the device 16 with liquid or supercritical carbon dioxide is conducted in the apparatus depicted in the drawing.

The semiconductor device 16 is disposed in a liquid or supercritical carbon dioxide contacting zone 14 of a processing chamber 12 of the apparatus wherein the semiconductor device 16 is exposed to liquid or supercritical carbon dioxide. The chamber 12, and specifically contacting zone 14, is designed to insure that the liquid or supercritical carbon dioxide remains in the liquid or supercritical state during processing. Thus, the processing chamber 12 is maintained at a pressure in the range of between about 1,000 psi and about 8,000 psi. More preferably, the pressure within process chamber 12 is in the range of between about 2,000 psi and about 5,000 psi. Still more preferably, the pressure within process chamber 12 is about 3,000 psi. The temperature within process chamber 12 is maintained in a range of between about 32° C. and about 100° C. Preferably, the temperature within process chamber 12 is maintained in a range of between about 40° C. and about 80° C. Still more preferably, the temperature within process chamber 12 is in the range of about 70° C.

Since it is critical that the above thermodynamic conditions be maintained during the processing of the present invention, process chamber 12 may be controlled by a heat controller 32 which has the capability to monitor the temperature in chamber 12 by means of a thermocouple 25. The measured temperature is adjusted by heating jacket 18, controlled by controller 32, in accordance with temperature control means well known in the art.

Liquid or supercritical carbon dioxide is provided into processing chamber 12 by means of a liquid or supercritical carbon dioxide source 30. As shown in the FIGURE, the liquid or supercritical carbon dioxide provided by source 30 may be prepressurized by a high pressure pump 28 disposed downstream of the source 30 of the liquid or supercritical carbon dioxide. The high pressure liquid or supercritical carbon dioxide is conveyed into processing chamber 12 by means of conduit 22. It is noted in passing that means are provided for the introduction of additional components, provided from storage area 36, to conduit 37, in communication with conduit 22. In the embodiment wherein a carbon dioxide composition is provided the solvent may be held in storage area 36 and be introduced into processing chamber 12 through conduit 37 which is in flow communication with conduit 22.

It is emphasized that the liquid or supercritical carbon dioxide may be recycled to provide a closed system. In that preferred embodiment a reservoir 34 is provided. Reservoir 34 collects and/or purifies liquid or supercritical carbon dioxide that exits processing chamber 12 through outduct 24. The liquid or supercritical carbon dioxide is recycled back into processing chamber 12 through conduit 35.

The following examples are given to illustrate the scope of the present invention. Because these examples are given for illustrative purposes only, the present invention should not be deemed limited thereto.

COMPARATIVE EXAMPLE 1

SiLK®, a polyphenylene dielectric material, described in U.S. Pat. No. 5,965,679, incorporated herein by reference, was cast upon a silicon wafer to provide a 500 nanometer (nm) thick layer thereon. The resultant polymeric film was tested to determine its dielectric constant. The dielectric constant of the polyphenylene film was measured using refractive index means, at 248 nm, as measured on an n, k elipsometer, manufactured by J. K. Wollan, using a method described by D. Van Krevelin, *Physical Properties of Polymers*, Elsevier Press, New York, 1976, at Page 237.

A summary of this example appears in the Table.

EXAMPLE 1

A silicon wafer, upon which a 500 nm thick layer of SiLK® was also disposed, was treated in an apparatus illustrated in the FIGURE in which the semiconductor device was exposed to supercritical carbon dioxide, at a pressure of 2,000 psi and a temperature of 32° C., for 5 minutes. Thereupon, processing chamber 12 was returned to ambient thermodynamic conditions. The thus treated silicon wafer was removed from the chamber 12 and the dielectric constant of the insulating polyphenylene film was again measured in accordance with the method discussed above.

A summary of this example is included in the Table.

EXAMPLE 2

Yet a third sample was also processed in chamber 12. However, although this sample was exposed to supercritical carbon dioxide for 5 minutes, thermodynamic conditions in the processing chamber 12 were different than in Example 1. Thermodynamic conditions were maintained at a pressure of 5,027 psi and a temperature of 70° C. Again, the dielectric constant was measured by refractive index means at 248 nm.

A summary of this example is included in the Table.

TABLE

| SiLK ® 500 nm on Silicon Wafer EXAMPLE NO. | Supercritical $CO_2$ Treatment | Dielectric Constant |
| --- | --- | --- |
| Comparative 1 | None | 3.39 |
| 1 | 2000 psi/32° C. for 5 min | 3.32 |
| 2 | 5027 psi/70° C. for 5 min | 3.29 |

EXAMPLE 3

A 450 nm thick film of SiLK® was disposed on a silicon wafer. A coating of water constituting less than 1% by weight, based on the polymeric film weight, was disposed atop the film layer and placed in contacting zone 14 of processing chamber 12. Thereupon, supercritical carbon dioxide was introduced into zone 14 of chamber 12 at a pressure of 6,500 psi and a temperature of 70° C. This contact continued for 15 minutes. Conditions in chamber 12 were then returned to ambient by opening the chamber to the atmosphere.

The product of this contact was a porous dielectric film layer. Atomic force microscopy and scanning electromicroscopy revealed holes and depressions in the film of over 10 nm.

The above embodiments and examples are provided to illustrate the scope and the spirit of the invention. These embodiment and examples will make apparent, to those-skilled in the art, other embodiments and examples. These other embodiments and examples are within the contemplation of the present invention. Therefore, the present invention should be limited only by the appended claims.

What is claimed is:

1. A process of insulating an electric assembly which includes semiconductor devices comprising the steps of:
   (a) disposing a film of a polymeric material upon a surface of a semiconductor device;
   (b) contacting said polymeric material with a porogen;
   (c) contacting said porogen-included polymeric material with liquid or supercritical carbon dioxide under thermodynamic conditions consistent with the maintenance of carbon dioxide in said liquid or supercritical state; and
   (d) adjusting said thermodynamic conditions under which said semiconductor device is maintained to those of ambient temperature and pressure.

2. A process in accordance with claim 1 wherein said polymeric material is selected from the group consisting of polyimides, fluorinated polymides, polyorganohydrosilanes, polysiloxanes, polyphenylenes, copolymers of divinylsiloxane and bisbenzocyclobutene, polybenzyl, polyarylethers and polyetrafluoroethylene.

3. A process in accordance with claim 2 wherein said polymeric material is polyphenlene.

4. A process in accordance with claim 1 wherein said porogen contacting step comprises disposing said porogen in a concentration of between about 0.1% end about 1% on a polyphenylene film, said percentages being by weight, based on the weight of said polyphenylene.

5. A process in accordance with claim 1 wherein said step (c) occurs at a temperature, in the range of between about 32° C. and about 100° C. and at a pressure in the range of between about 1,000 psi and about 8,000 psi.

6. A process in accordance with claim 1 wherein said porogen is selected from the group consisting of water, acetone, toluene, methanol, ethanol, propanol and mixtures thereof.

7. A process in accordance with claim 1 wherein said porogen is disposed on the surface of said polymeric material.

8. A process in accordance with claim 7 wherein said porogen is water.

* * * * *